US011869950B2

(12) United States Patent
Choi et al.

(10) Patent No.: US 11,869,950 B2
(45) Date of Patent: Jan. 9, 2024

(54) STEEP-SLOPE FIELD-EFFECT TRANSISTOR AND FABRICATION METHOD THEREOF

(71) Applicant: Korea Advanced Institute of Science and Technology, Daejeon (KR)

(72) Inventors: Yang-Kyu Choi, Daejeon (KR); Myung-Su Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 225 days.

(21) Appl. No.: 17/437,368

(22) PCT Filed: Jul. 29, 2021

(86) PCT No.: PCT/KR2021/009918
§ 371 (c)(1),
(2) Date: Sep. 8, 2021

(87) PCT Pub. No.: WO2022/030884
PCT Pub. Date: Feb. 10, 2022

(65) Prior Publication Data
US 2022/0223705 A1     Jul. 14, 2022

(30) Foreign Application Priority Data

Aug. 5, 2020  (KR) .................. 10-2020-0098003

(51) Int. Cl.
*G11C 11/34*         (2006.01)
*H01L 29/423*        (2006.01)
(Continued)

(52) U.S. Cl.
CPC ........ *H01L 29/42324* (2013.01); *G11C 16/10* (2013.01); *H01L 29/40114* (2019.08); *H01L 29/66825* (2013.01); *H01L 29/7881* (2013.01)

(58) Field of Classification Search
CPC ........ H01L 29/42324; H01L 29/40114; H01L 29/66825; H01L 29/7881; G11C 16/10
(Continued)

(56) References Cited

U.S. PATENT DOCUMENTS 6,191,463 B1 *  2/2001  Mitani ............. H01L 29/66772
                                                     257/E29.345
6,906,391 B2 *  6/2005  Sudo ................. H01L 21/28202
                                                     257/411
(Continued)

FOREIGN PATENT DOCUMENTS

CN       104779252 A  *  7/2015  ........... G11C 11/005
JP       2015144271 A      8/2015
(Continued)

OTHER PUBLICATIONS

International Search Report for PCT/KR2021/009918, entitled: Steep-Slope Field-Effect Transistor and Fabrication Method Thereof, dated Nov. 18, 2021.

(Continued)

*Primary Examiner* — Viet Q Nguyen
(74) *Attorney, Agent, or Firm* — Hamilton, Brook, Smith & Reynolds, P.C.

(57) ABSTRACT

A steep-slope field-effect transistor and a fabrication method thereof are disclosed. The steep-slope field-effect transistor according to an embodiment of the inventive concept includes a source, a channel region, and a drain formed on a substrate; a gate insulating film formed on an upper portion of the channel region; a floating gate formed on an upper portion of the gate insulating film; a transition layer formed on an upper portion of the floating gate; and a control gate formed on an upper portion of the transition layer. The steep-slope field-effect transistor applies a reference poten- (Continued)

tial or more to the control gate to discharge or bring in at least one charge stored in the floating gate.

21 Claims, 11 Drawing Sheets

(51) Int. Cl.
  *H01L 21/28* (2006.01)
  *G11C 16/10* (2006.01)
  *H01L 29/66* (2006.01)
  *H01L 29/788* (2006.01)

(58) Field of Classification Search
  USPC .................................................. 365/185.18
  See application file for complete search history.

(56) References Cited

U.S. PATENT DOCUMENTS

| | | | |
|---|---|---|---|
| 7,402,850 B2* | 7/2008 | Bhattacharyya | H01L 29/4232 |
| | | | 257/314 |
| 7,550,801 B2* | 6/2009 | Kikuchi | H01L 29/518 |
| | | | 257/316 |
| 7,915,664 B2* | 3/2011 | Chien | H10B 41/30 |
| | | | 257/326 |
| 8,902,663 B1 | 12/2014 | Or-Bach et al. | |
| 9,312,268 B2* | 4/2016 | Toh | H01L 29/7881 |
| 9,331,209 B2* | 5/2016 | Jain | H01L 29/42332 |
| 9,852,801 B1* | 12/2017 | Coignus | G11C 16/0408 |
| 9,966,476 B2* | 5/2018 | Risaki | H01L 29/513 |
| 10,262,747 B2* | 4/2019 | Hirose | G11C 16/0466 |
| 10,714,634 B2* | 7/2020 | Yang | H10B 41/41 |
| 2004/0036108 A1 | 2/2004 | Rudeck | |
| 2006/0145136 A1 | 7/2006 | Verhoeven | |
| 2008/0251825 A1 | 10/2008 | Lee | |
| 2017/0365663 A1 | 12/2017 | Zhao et al. | |
| 2019/0267446 A1 | 8/2019 | Hou et al. | |
| 2022/0270660 A1* | 8/2022 | Choi | G11C 11/4096 |

FOREIGN PATENT DOCUMENTS

| | | | | |
|---|---|---|---|---|
| JP | 2017050537 A | | 3/2017 | |
| JP | 2020031213 A | | 2/2020 | |
| KR | 10-2010-0078685 | | 7/2010 | |
| TW | 201431947 A | * | 8/2014 | C08K 3/22 |
| TW | 10-2019-0049335 | | 5/2019 | |

OTHER PUBLICATIONS

Wong, M. et al., "Analysis of the Subthreshold Slope and the Linear Transconductance Techniques for the Extraction of the Capacitance Coupling Coefficients of Floating-Gate Devices," IEEE Electron Device Letters, 13(11): 566-568 (Nov. 1992).

Cao, W., and Banerjee, K., "Is negative Capacitance FET a steep-slope logic switch?" Nature Communications, pp. 1-8 (Jan. 2020).

Office Action for U.S. Appl. No. 17/674,301, dated Sep. 6, 2023.

* cited by examiner

STEEP-SLOPE FIELD-EFFECT TRANSISTOR AND FABRICATION METHOD THEREOF

This application is the U.S. National Stage of International Application No. PCT/KR2021/009918, filed Jul. 29, 2021, which designates the U.S., not yet published, and claims priority under 35 U.S.C. § 119 or 365(c) to Korean Application No. 10-2020-0098003, filed Aug. 5, 2020. The entire teachings of the above applications are incorporated herein by reference.

TECHNICAL FIELD

Embodiments of the inventive concept described herein relate to a structure of a field-effect transistor (FET) capable of performing a steep-slope operation and a fabrication method thereof, and more particularly, relate to a steep-slope FET capable of implementing steep-slope performance, in a transistor having a transition layer and a control gate on an upper portion of a gate of an existing FET, and a fabrication method thereof.

BACKGROUND ART

In the era of the 4th industrial revolution, recently, there has been a rapid increase in demand for related industries such as artificial intelligence (AI), autonomous vehicles, big data, augmented/virtual reality (AR/VR), and Internet of Things (IoT). The importance and market of the semiconductor industry which is the basis of all these industries is gradually growing. To produce, store, and process vast amounts of data incapable being processed in the past in mobile devices, large servers, and the like, high performance and high integration of semiconductor devices and low power consumption for reducing the increased power consumption due to this are essential.

The semiconductor industry has developed rapidly after the development of a metal-oxide-semiconductor field-effect transistor (MOSFET) using silicon (Si) and silicon oxide (SiO2) in the 1960s. The development of these silicon-based MOSFET miniaturization processes and technologies has successfully led the semiconductor industry, but due to the unique physical and material characteristics of silicon semiconductors, performance improvement through ultra-fine processes is limited. Furthermore, high leakage current derived from miniaturization and high power consumption caused by a relatively high operating voltage are emerging as one of the current biggest problems of silicon-based semiconductor devices.

The power consumption of the semiconductor device is defined as a value obtained by adding operation power consumption, short-circuit power consumption, and leakage power consumption. To reduce total power consumption, both of a leakage current value in an off-state and a driving voltage necessary to make an on-state among transistor performance indexes should be reduced.

Meanwhile, because channel establishment is caused by means of thermionic diffusion, an existing MOSFET has a threshold of an on-off switching operation speed depending on temperature. Such a switching operation is determined as a slope value of a transistor electrical characteristic, that is, subthreshold swing (SS). This SS value is unable to be less than 60 mV/decade which is a physical limit value at room temperature. Due to this limit, the existing MOSFET is unable to decrease a driving voltage to a certain level or less. Particularly, at a current time when power consumption in a static state more increases than power consumption in a dynamic state, there is a need to develop a new concept device capable of reducing the power consumption in the static state.

Thus, to address such a problem and reduce both the driving voltage and the leakage current, there is an urgent need to discover a new on-off switching mechanism which is completely different from the existing operating mechanism dependent on thermal diffusion. Because the development of a so-called new concept steep-slope semiconductor device for overcoming the limit of 60 mV/dec of a silicon-based CMOS is able to reduce an operating voltage and simultaneously decrease a leakage current to address a low voltage of the existing semiconductor device, a low power of the existing semiconductor device, and the limit of an integration level, it is expected to become a technology that not only replaces the existing MOSFET-based semiconductor device, but also leads the 4th industrial revolution in the future.

Various steep-slope field-effect transistors are developed to overcome the limit of the MOSFET, but existing steep-slope field-effect transistors operate with an operation principle of a structure different from the MOSFET to have a smaller on-current than the MOSFET and have a limitation in miniaturization. In addition, the drain current duration showing the steep-slope is only 30% of the entire switching current duration.

Thus, there is a need for a structure capable of addressing all of on-current, limited steep-slope performance, and a probability of miniaturization, which are limitations of the existing steep-slope field-effect transistors.

DETAILED DESCRIPTION OF THE INVENTION

Technical Problem

Embodiments of the inventive concept provide a steep-slope field-effect transistor capable of implementing steep-slope performance, a transistor having a transition layer and a control gate on an upper portion of a gate of an existing FET, and a fabrication method thereof.

In detail, the inventive concept provides a structure of a new structure steep-slope field-effect transistor for meeting a high on-current and a probability of miniaturization based on the structure and the operation principle of the existing MOSFET and simultaneously showing SS performance of 50% or more of the entire switching current duration and 60 mV/dec or less, an operation principle, and a fabrication method thereof.

Herein, technical problems to be addressed by the inventive concept are not limited to the problem, and may be expanded in various manners from a common part which does not deviate from the technical spirit and scope and the inventive concept.

Technical Solution

According to an exemplary embodiment, a steep-slope field-effect transistor may include a source, a channel region, and a drain formed on a substrate, a gate insulating film formed on an upper portion of the channel region, a floating gate formed on an upper portion of the gate insulating film, a transition layer formed on an upper portion of the floating gate, and a control gate formed on an upper portion of the transition layer.

The steep-slope field-effect transistor may apply a reference potential or more to the control gate to discharge or bring in at least one charge stored in the floating gate.

The channel region may be formed as one of a non-embedded structure including a planar structure, a fin structure, a nanosheet structure, a nanowire structure, and a multi-nanowire structure and an embedded structure.

The channel region of the non-embedded structure may be formed as one of the fin structure, the nanosheet structure, the nanowire structure, and the multi-nanowire structure used in a finFET, a tri-gate MOSFET, a Π-gate MOSFET, an Ω-gate MOSFET, a gate-all-around MOSFET, a bulk finFET, or a bulk gate-all-around MOSFET.

The channel region of the embedded structure may be formed as one of embedded channel structures used in a buried gate MOSFET, a recessed gate MOSFET, a sphere-shaped recessed gate MOSFET, a saddle finFET, a groove gate MOSFET, or a V-groove gate MOSFET.

The channel region, the source, and the drain may include at least one of silicon, germanium, silicon-germanium, strained silicon, strained germanium, strained silicon-germanium, silicon on insulator (SOI), and III-V semiconductor materials.

The source and the drain may be formed on left and right sides of the channel region for a lateral transistor, may be formed on upper and lower portions of the channel region for a vertical transistor, and may be formed of one of n-type silicon, p-type silicon, and metal silicide.

The source and the drain formed of the n-type silicon or the p-type silicon may be formed by at least one of diffusion, solid-phase diffusion, epitaxial growth, selective epitaxial growth, ion implantation, or subsequent heat-treatment.

The source and the drain formed of the metal silicide may include the metal silicide formed of one of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), and iridium (Ir) to improve junction using dopant segregation.

The gate insulating film may include at least one of silicon oxide (SiO2), silicon nitride (Si3N4), silicon oxynitride (SiON), hafnium oxide (HfO2), aluminum oxide (Al2O3), zirconium oxide (ZrO2), hafnium zirconium oxide (HZO), or hafnium oxynitride (HfON).

The floating gate may be formed by at least one or more of metal, two or three types of metal alloys, n+ polycrystalline silicon, p+ polycrystalline silicon, or silicide.

The floating gate may be formed as at least one of a non-embedded gate structure including a planar-gate structure, a multiple-gate structure, or a gate-all-around structure and an embedded gate structure, depending on a channel structure.

The floating gate of the non-embedded gate structure may be formed as one of non-embedded gate structures used in a finFET, a tri-gate MOSFET, a Π-gate MOSFET, an Ω-gate MOSFET, a gate-all-around MOSFET, a bulk finFET, or a bulk gate-all-around MOSFET.

The floating gate of the embedded gate structure may be formed as one of embedded gate structures used in a buried gate MOSFET, a recessed gate MOSFET, a sphere-shaped recessed gate MOSFET, a saddle finFET, a groove gate MOSFET, or a V-groove gate MOSFET.

The transition layer may be formed including silicon (Si), germanium (Ge), Group III-V compounds, a 2-D material (at least one of carbon nanotube, MoS2, and graphene), silicon nitride (Si3N4), a nitride film, silicon oxynitride (SiON), silicon oxide (SiO2), a solid oxide film, aluminum oxide (Al2O3), IGZO, hafnium oxide (HfO2), a transition material, a semiconductor material (SrTiO3, SrZrO3, NiO, TiO2, HfOx, AlOx, NiOx, TiOx, TaOx, TaN, CuxO, CuOx, TiN, TaN, WOx, SiNx, VO2, IrO2, ZrOx, ZnO, NbOx, IGZO, HZO, or HfON), a solid electrolyte material (wherein the solid electrolyte material includes a sulfide-based material, an oxide-based material, and an ion conductive polymer).

The steep-slope field-effect transistor may apply a potential of a reference voltage or more to the control gate to generate a potential difference between the control gate and the floating gate and may discharge or bring in at least one charge stored in the floating gate.

The steep-slope field-effect transistor may more increase a change in voltage of the floating gate than a change in voltage of the control gate, when the control gate arrives at a specific voltage region, in a situation where at least one charge stored in the floating gate passes through an energy barrier by the transition layer to be discharged or brought in to the control gate, when a potential of a reference voltage or more is applied to the control gate.

The steep-slope field-effect transistor may more decrease a slope value of a threshold voltage or less, when putting the control gate as a gate to operate a device than when putting the floating gate as a gate to operate the device.

According to another exemplary embodiment, a fabrication method of a steep-slope field-effect transistor may include forming a source, a channel region, and a drain on a substrate, forming a gate insulating film on an upper portion of the channel region, forming a floating gate on an upper portion of the gate insulating film, forming a transition layer on an upper portion of the floating gate, and forming a control gate on an upper portion of the transition layer.

The forming of the control gate may include forming an inter-layer dielectric on an upper portion of the transition layer, etching the inter-layer dielectric to expose a portion of the upper portion of the transition layer, and forming the control gate on an upper portion of the exposed transition layer.

According to another exemplary embodiment, an operation method for a steep-slope field-effect transistor including a source, a channel region, and a drain formed on a substrate, a gate insulating film formed on an upper portion of the channel region, a floating gate formed on an upper portion of the gate insulating film, a transition layer formed on an upper portion of the floating gate, and a control gate formed on an upper portion of the transition layer may include applying a certain voltage to the control gate, such that a potential difference of a reference voltage or more is generated between the control gate and the floating gate and discharging or bringing in at least one charge stored in the floating gate by means of the potential difference of the reference voltage, the potential difference being generated between the control gate and the floating gate.

Advantageous Effects of the Invention

According to an embodiment of the inventive concept, steep-slope performance may be implemented, in a transistor having a transition layer and a control gate on an upper portion of a gate of an existing FET.

Such an inventive concept may meet a high on-current and a probability of miniaturization based on the structure and the operation principle of the existing MOSFET and may simultaneously show SS performance of 50% or more of the entire switching current duration and 60 mV/dec or less. By means of the structure and method, a semiconductor device having the steep-slope performance while ensuring the high on-current and the probability of miniaturization of the existing MOSFET without change may be implemented. Thus, a low-power operation of the semiconductor device is possible.

An embodiment of the inventive concept is applicable to various devices and systems including a logic device of the inventive concept. Thus, the inventive concept may be useful for various electronic devices such as a mobile phone, a smartphone, a PDA, a PMP, a digital camera, a camcorder, a PC, a server computer, a workstation, a notebook, a digital TV, a set-top box, a music player, a portable game console, a navigation device, a wearable device, an IoT device, a VR device, and an AR device.

Herein, the effect of the inventive concept is not limited to the effects and may be expanded in various manners from a common part which does not deviate from the technical spirit and scope and the inventive concept.

BEST MODE

Advantages, features, and methods of accomplishing the same will become apparent with reference to embodiments described in detail below together with the accompanying drawings. However, the inventive concept is not limited by embodiments disclosed hereinafter, and may be implemented in various forms. Rather, these embodiments are provided so that this disclosure will be through and complete and will fully convey the concept of the invention to those skilled in the art, and the inventive concept will only be defined by the scope of the appended claims.

Terms used in the specification are used to describe embodiments of the inventive concept and are not intended to limit the scope of the inventive concept. In the specification, the terms of a singular form may include plural forms unless otherwise specified. The expressions "comprise" and/or "comprising" used herein indicate existence of stated components, steps, operations, and/or elements, but do not exclude presence or addition of one or more other components, steps, operations, and/or elements.

Unless otherwise defined herein, all terms (including technical and scientific terms) used in the specification may have the same meaning that is generally understood by a person skilled in the art. Also, terms which are defined in a dictionary and commonly used should be interpreted as not in an idealized or overly formal detect unless expressly so defined.

Hereinafter, exemplary embodiments of the inventive concept will be described in detail with reference to the accompanying drawings. The same reference denotations are used for the same components on the drawings, and a duplicated description of the same components will be omitted.

Embodiments of the inventive concept have the subject matter of implementing steep-slope performance, in a transistor having a transition layer and a control gate on an upper portion of a gate of an existing FET.

Because of having a steep-slope on a current-voltage characteristic curve and being shown in the form of a Greek capital letter, 'Γ' (gamma), in appearance, a semiconductor device in the inventive concept is referred to as a Γ-FET to be used.

The Γ-FET may implement steep-slope performance while maintaining high on-current and a probability of miniaturization, which are advantages of an existing MOSFET, thus facilitating a low-power operation of the device.

Figure 1:
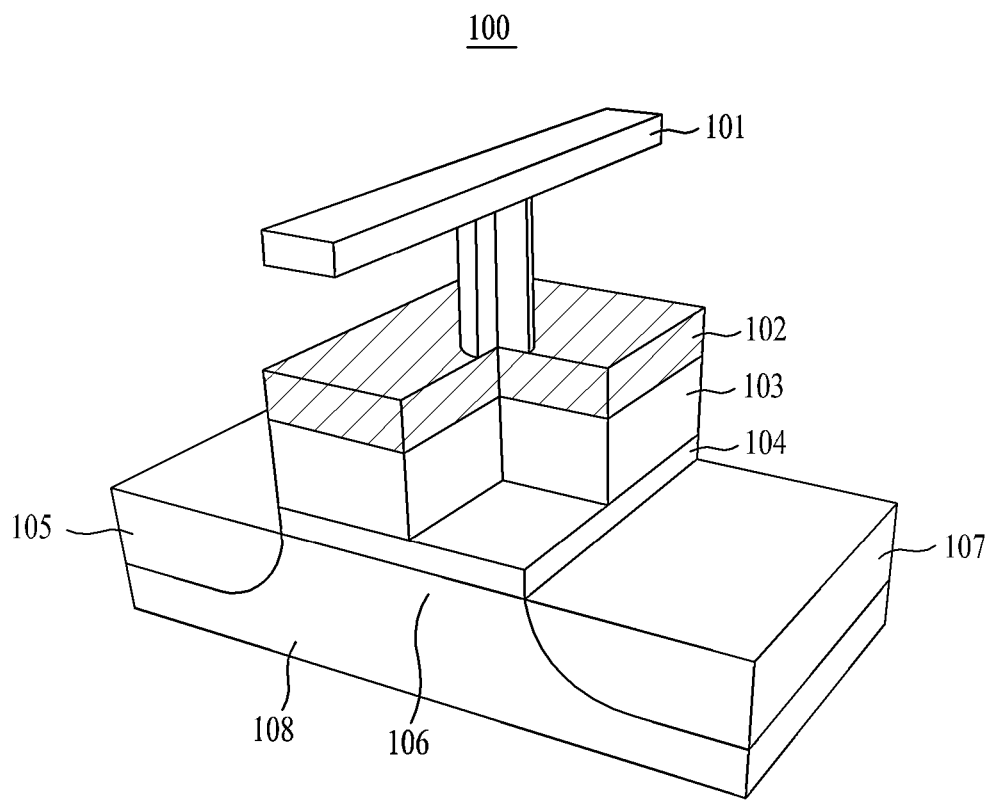
FIG. 1 is a perspective view illustrating a steep-slope field-effect transistor Γ-FET according to embodiments of the inventive concept.
Figure 2:
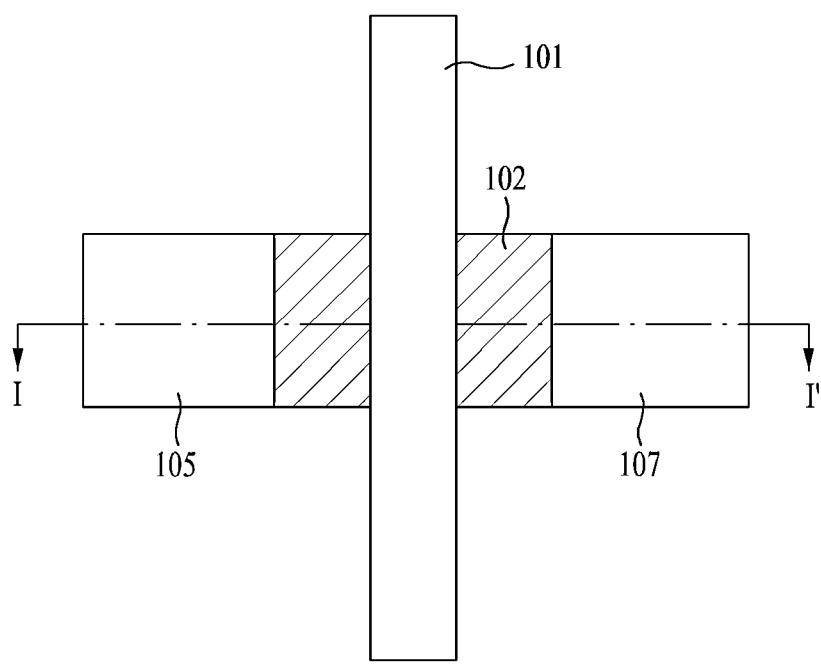
FIG. 2 is a plan view illustrating the steep-slope field-effect transistor of FIG. 1.
Figure 3:
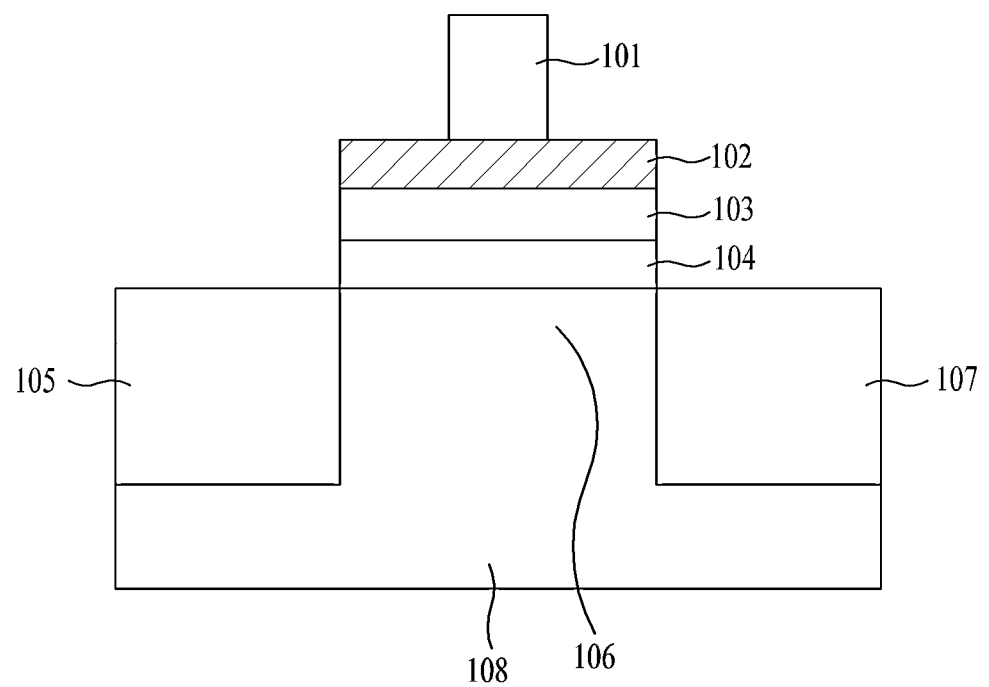
FIG. 3 is a cross-sectional view taken along the line I-I' of FIG. 2.
Figure 4:
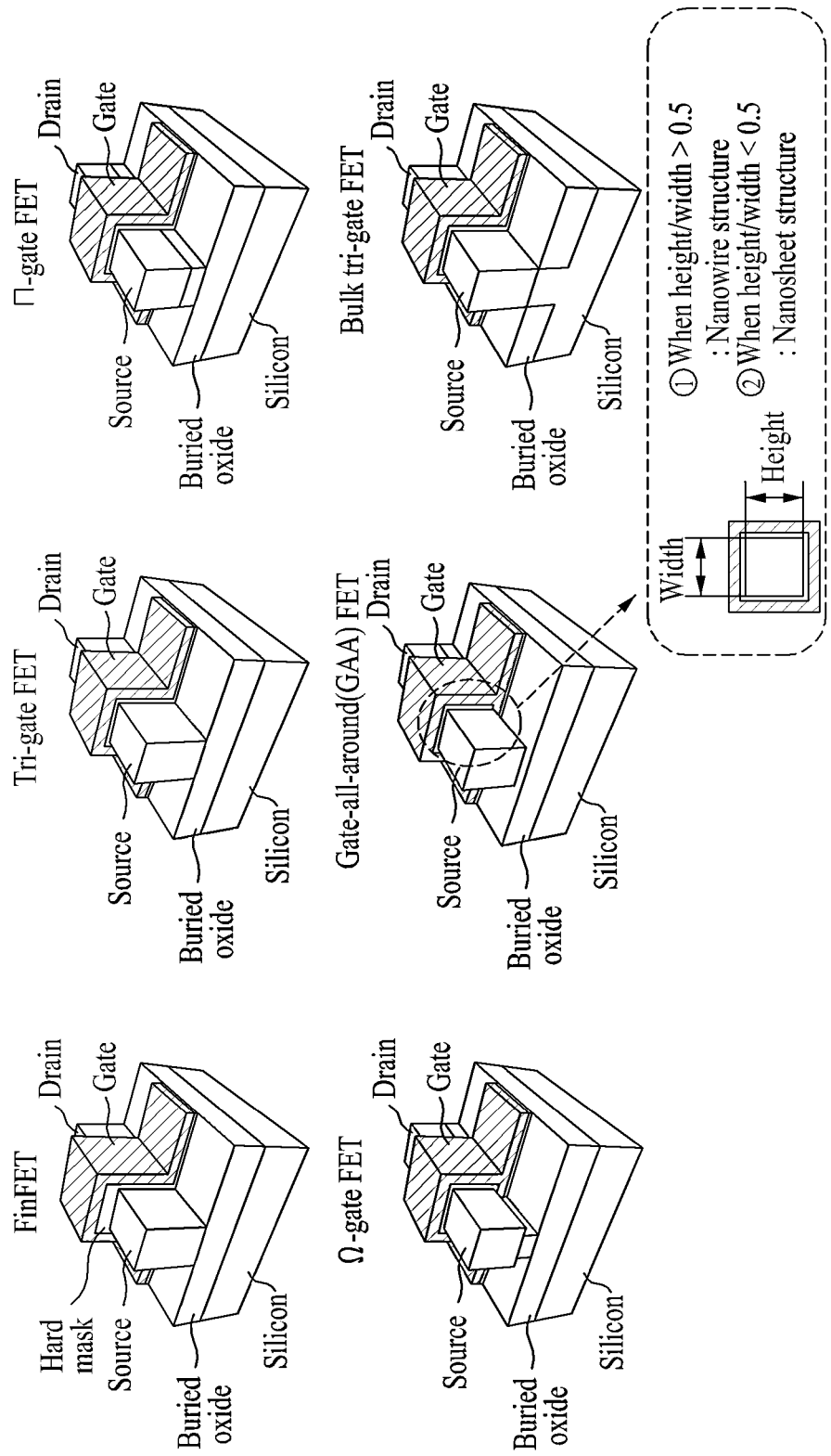
FIG. 4 is a view illustrating various non-embedded gate FET structures capable of being used as a lower MOSFET under a transition layer in Γ-FET.
Figure 5:
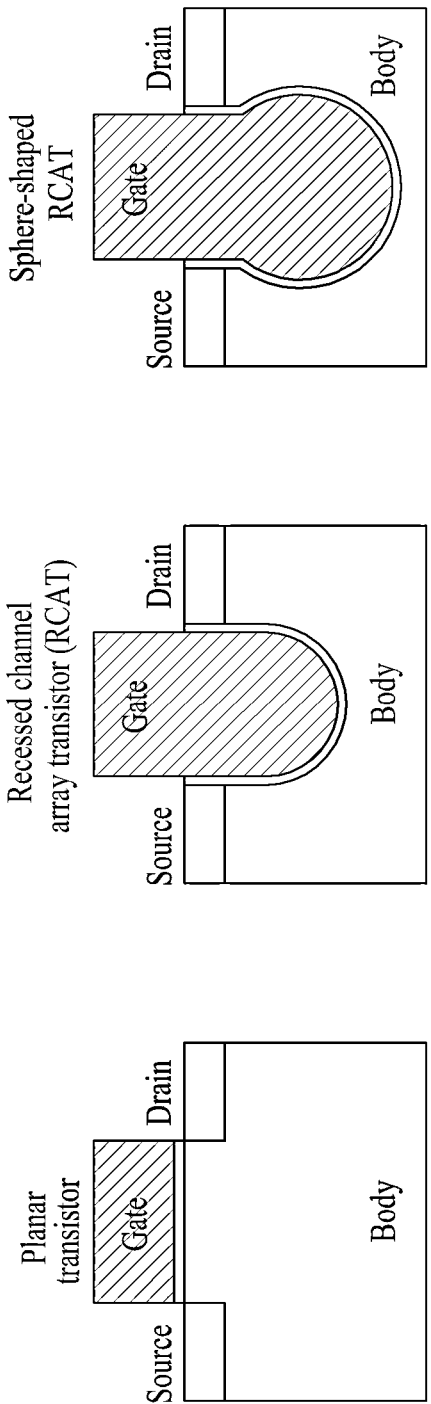
FIG. 5 is a view illustrating various embedded gate FET structures capable of being used as a lower MOSFET under a transition layer in Γ-FET.

FIG. 1 is a perspective view illustrating a steep-slope field-effect transistor Γ-FET 100 according to embodiments of the inventive concept. FIG. 2 is a plan view seen from the top. FIG. 3 is a cross-sectional view taken along the line I-I' of FIG. 2. FIGS. 4 and 5 are views illustrating various non-embedded and embedded gate FET structures capable of being used as a lower MOSFET under a transition layer in Γ-FET.

The Γ-FET may have a structure where a transition layer 102 and a control gate 101 are formed on a gate of an existing MOSFET and may use MOSFETs of various structures used in the field as lower MOSFETs. The Γ-FET may be fabricated by using MOSFETs of non-embedded and embedded structures partially shown in FIGS. 4 and 5 other than flat MOSFETs shown in FIGS. 1 to 3 as lower MOSFETs.

Referring to FIGS. 1 to 3, the Γ-FET 100 may include a substrate 108, a channel region 106, a gate insulating film 104, a floating gate 103, a transition layer 102, a control gate 101, a source 105 and a drain 107.

The substrate 108 may include at least one of silicon, germanium, silicon-germanium, strained silicon, strained germanium, strained silicon-germanium, silicon on insulator (SOI), and III-V semiconductor materials.

The source 105 and the drain 107 may be formed on left and right sides of the channel region 106 for a lateral transistor, may be formed on upper and lower portions of the channel region 106 for a vertical transistor, and may be formed of one of n-type silicon, p-type silicon, and metal silicide.

The source 105 and the drain 107 formed of the n-type or the p-type silicon may be formed by at least one of diffusion, solid-phase diffusion, epitaxial growth, selective epitaxial growth, ion implantation, or subsequent heat-treatment.

The source 105 and the drain 107 formed of the metal silicide may include the metal silicide formed of one of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), plumbum (Pb), and iridium (Ir), which may improve junction using dopant segregation.

The channel region 106 may be formed as one of a non-embedded structure, such as a fin structure, a nanosheet structure in a form where an aspect ratio (height/width) of the channel region is less than or equal to 0.5, a nanowire structure in a form where the aspect ratio (height/width) of the channel region is greater than or equal to 0.5, or a multi-nanowire structure, which is partially shown in FIG. 4, including a planar structure or an embedded structure partially shown in FIG. 5.

Herein, the channel region of the embedded structure may be formed as one of embedded channel structures used in a buried gate MOSFET, a recessed gate MOSFET, a sphere-shaped recessed gate MOSFET, a saddle finFET, a groove gate MOSFET, or a V-groove gate MOSFET.

The gate insulating film 104 may be formed on an upper portion of the channel region 106. The gate insulating film 104 may insulate the floating gate 103 and the channel region 106. For example, the gate insulating film 104 may be formed including at least one of silicon oxide ($SiO_2$), silicon nitride ($Si_3N_4$), silicon oxynitride (SiON), hafnium oxide ($HfO_2$), aluminum oxide ($Al_2O_3$), zirconium oxide ($ZrO_2$), hafnium zirconium oxide (HZO), and hafnium oxynitride (HfON). Furthermore, the gate insulating film 104 may be formed including at least one of any insulating materials which do not show a memory characteristic.

The floating gate 103 may be formed on an upper portion of the gate insulating film 104. For example, the floating gate 103 may be formed by at least one or more of metal, two or three types of metal alloys, n+ polycrystalline silicon, p+ polycrystalline silicon, or silicide (e.g., tungsten silicide (WSi), titanium silicide (TiSi), cobalt silicide (CoSi), nickel silicide (NiSi), or the like). Because the floating gate 103 is located between a control gate and a channel region (or a channel), it may be referred to as an internal gate.

The floating gate 103 may be formed as at least one of a non-embedded gate structure, such as a multiple-gate structure partially shown in FIG. 4 or a gate-all-around structure, including a planar-gate structure, and an embedded gate structure partially shown in FIG. 5, depending on a channel structure.

In this case, the floating gate of the non-embedded gate structure may be formed as one of non-embedded gate structures used in a finFET, a tri-gate MOSFET, a Π-gate MOSFET, an Ω-gate MOSFET, a gate-all-around MOSFET, a bulk finFET, or a bulk gate-all-around MOSFET.

In this case, the floating gate of the embedded gate structure may be formed as one of embedded gate structures used in a buried gate MOSFET, a recessed gate MOSFET, a sphere-shaped recessed gate MOSFET, a saddle finFET, a groove gate MOSFET, or a V-groove gate MOSFET.

The transition layer 102 may be formed on an upper portion of the floating gate 103. The transition layer 102 may insulate the floating gate 103 and the control gate 101 (or a control gate structure). For example, the transition layer 102 may be formed including at least one of silicon (Si), germanium (Ge), Group III-V compounds, a 2-D material (at least one of and carbon nanotube, $MoS_2$, and graphene), silicon nitride ($Si_3N_4$), a nitride film, silicon oxynitride (SiON), silicon oxide ($SiO_2$), a solid oxide film, aluminum oxide ($Al_2O_3$), IGZO, hafnium oxide ($HfO_2$), various other transition materials, a semiconductor material ($SrTiO_3$, $SrZrO_3$, NiO, $TiO_2$, $HfO_x$, $AlO_x$, $NiO_x$, $TiO_x$, $TaO_x$, TaN, $Cu_xO$, $CuO_x$, TiN, TaN, $WO_x$, $SiN_x$, $VO_2$, $IrO_2$, $ZrO_x$, ZnO, $NbO_x$, IGZO, HZO, or HfON), a solid electrolyte material (a sulfide-based material (e.g., $Li_{10}GeP_2S_{12}$, $Li_{9.545}Si_{1.74}P_{1.44}S_{11.7}Cl_{0.3}$, argyrodite, LPS (lithium phosphorus sulfide), LPS+LiCl), an oxide-based material (e.g., perovskite, NASICON ($Na_{1+x}NZr_2Si_xP_{3x}O_{12}$, 0<x<3), LISICON ($Li_{2+2x}Zn_{1x}GeO_4$), LiPON ($Li_xPO_yN_z$), garnet) or an ion conductive polymer (e.g., polyethylene oxide (PEO), polyethylene glycol (PEG), a polyethylene glycol dimethacrylate (PEGDMA), polytetrafluoroethylene (PTFE), polyether ether ketone (PEEK), or nafion ($C_7HF_{13}O_5S$—$C_2F_4$)).

Such a transition layer 102 may be composed of a single material or several materials.

In an embodiment, an area of the floating gate 103 with which the transition layer 102 or the control gate 101 is in contact may be narrower than the entire area of the floating gate 103. In other words, the transition layer 102 and the control gate 101 may be formed on at least a portion of an upper portion of the floating gate 103.

The control gate 101 may be formed on an upper portion of the transition layer 102 and may generate a potential difference with the floating gate 103. For example, the control gate 101 may be formed adjacent to the floating gate 103 to allow current to flow to the floating gate 103.

In an embodiment, the control gate 101 may be formed by one or more of metal, two or three types of metal alloys, n+ polycrystalline silicon, p+ polycrystalline silicon, or silicide (e.g., tungsten silicide (WSi), titanium silicide (TiSi), cobalt silicide (CoSi), nickel silicide (NiSi), or the like).

When a voltage signal is applied to the control gate 101, the transition layer 102 may allow current to flow to the floating gate 103 depending on a voltage difference between gates of both ends, that is, a voltage difference between the floating gate 103 and the control gate 101.

In the inventive concept, all the channel region 106, the source 105, and the drain 107 may be formed on the substrate 108. For example, the channel region 106 may be formed as a nanowire structure. In this case, as shown in FIG. 3, the gate insulating film 104, the floating gate 103, the transition layer 102, and the control gate 101 may be formed to sequentially surround a portion of the channel region 106, and an empty space may be present between the rest of the channel region 106 (e.g., the other portion except for the portion) and the substrate 108. In other words, the channel region 106 may be supported by the components 104, 103, 102, and 101 and may float like a bridge on the substrate 108.

The Γ-FET 100 of the inventive concept having such a structure may apply a potential of a reference voltage or more to the control gate 101 to generate a potential difference between the control gate 101 and the floating gate 103, thus discharging or bringing in at least one charge stored in the floating gate 103.

At this time, when the potential of the reference voltage or more is applied to the control gate 101, in a situation where at least one charge stored in the floating gate 103 passes through an energy barrier by the transition layer 102 to be discharged/brought in to the control gate 101, when the control gate 101 arrives at a specific voltage region, the Γ-FET 100 may more increase a change in voltage of the floating gate 103 than a change in voltage of the control gate 101.

At this time, the Γ-FET 100 may more decrease a sub-threshold slope (SS) value of a threshold voltage or less, when putting a control gate electrode as a gate to operate a device, than when putting a floating gate electrode as a gate to operate the device.

Figure 6:
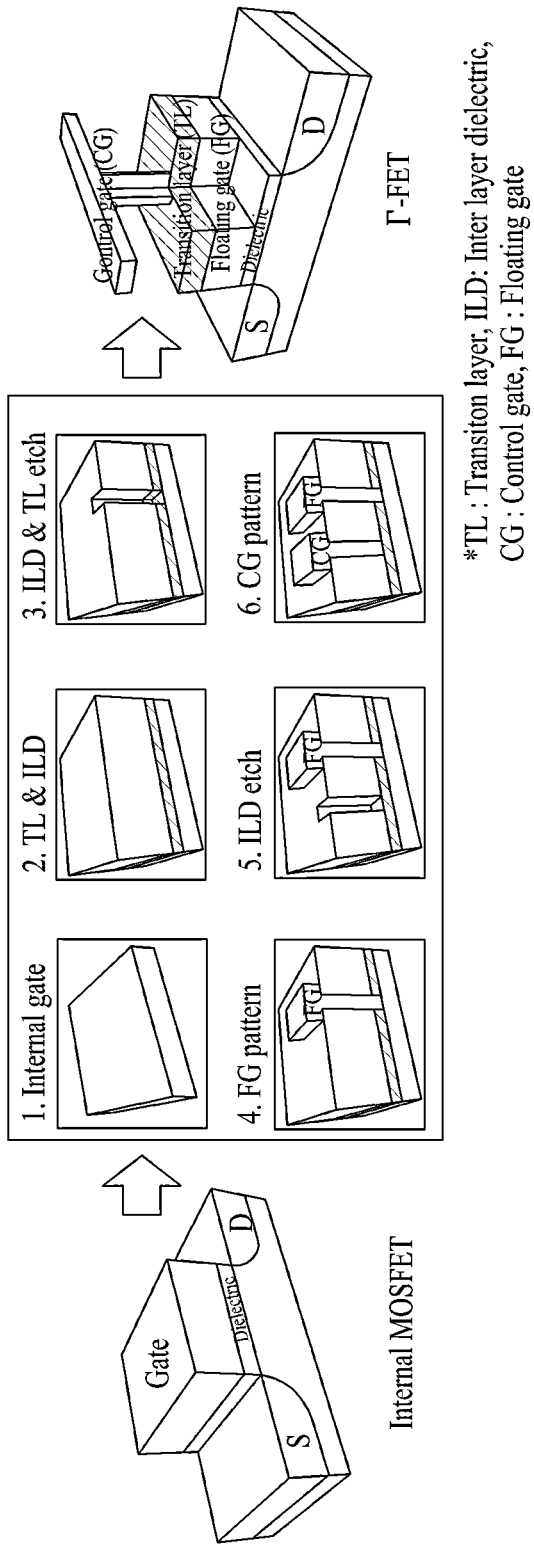
FIG. 6 is a view illustrating a process of fabricating a steep-slope field-effect transistor according to embodiments of the inventive concept.

FIG. 6 is a view illustrating a process of fabricating a Γ-FET 100.

Referring to FIG. 6, the Γ-FET of the inventive concept may form an existing MOSFET structure (an internal MOSFET) through a process of forming a channel region, a source, and a drain on a substrate, forming a gate insulating film on an upper portion of the channel region, and forming a floating gate on an upper portion of the gate insulating film.

A transition layer TL and an inter-layer dielectric (ILD) may be sequentially formed on an upper portion of the floating gate, and a portion of the TL and the ILD may be etched such that a portion of the floating gate is exposed. As a portion of the TL and the ILD may be etched to form a floating gate pattern and as a portion of the ILD is etched to form a control gate pattern such that a portion of the TL is exposed, the Γ-FET of the inventive concept may be fabricated.

Figure 7:
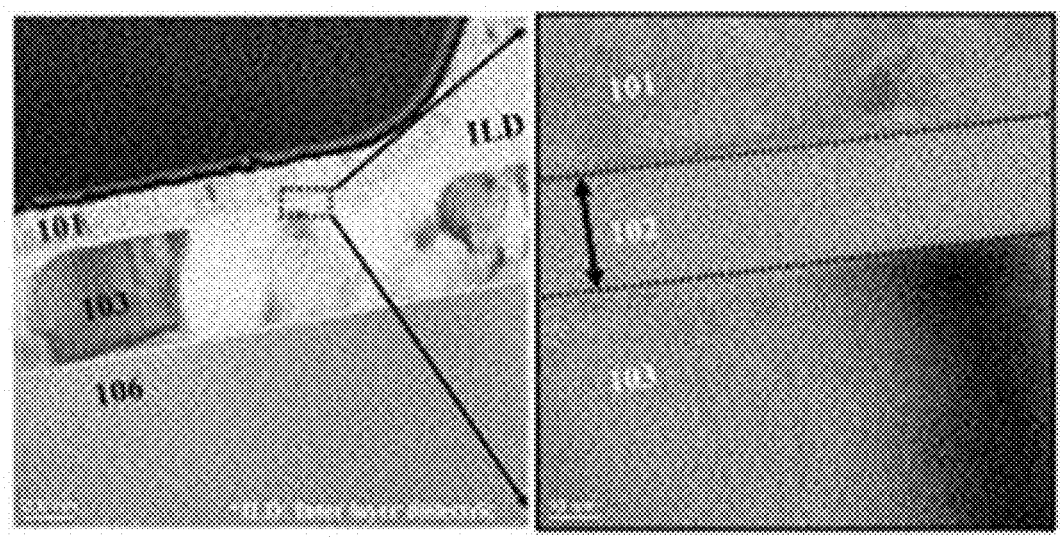
FIG. 7 is a view illustrating a transmission electron microscopy picture of a device fabricated according to an embodiment of the inventive concept.
Figure 8:
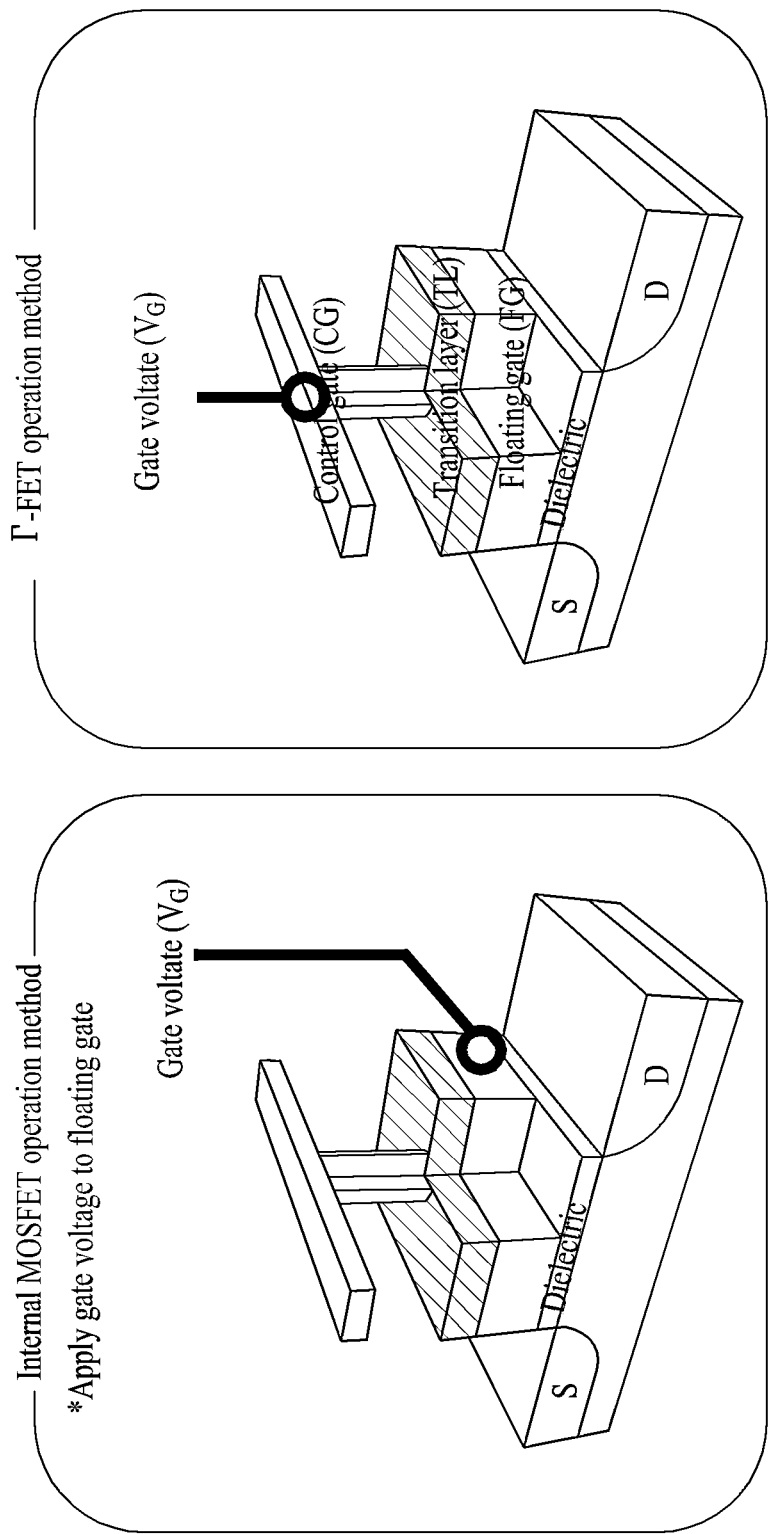
FIG. 8 is a view schematically illustrating an environment where a steep-slope field-effect transistor is measured according to embodiments of the inventive concept.

FIG. 7 is a view illustrating a transmission electron microscopy picture of a device fabricated according to an embodiment of the inventive concept, that is, a Γ-FET 100. FIG. 8 is a view schematically illustrating an environment where a Γ-FET 100 is measured according to embodiments of the inventive concept. An electrical characteristic of the Γ-FET 100 may be ensured by applying voltage to a control gate 101. Furthermore, voltage may be applied to a floating gate 103 on purpose to verify a characteristic of a lower MOSFET to be compared with it. There is no need to separately apply voltage to the floating gate in an actual device operation.

Figure 9:
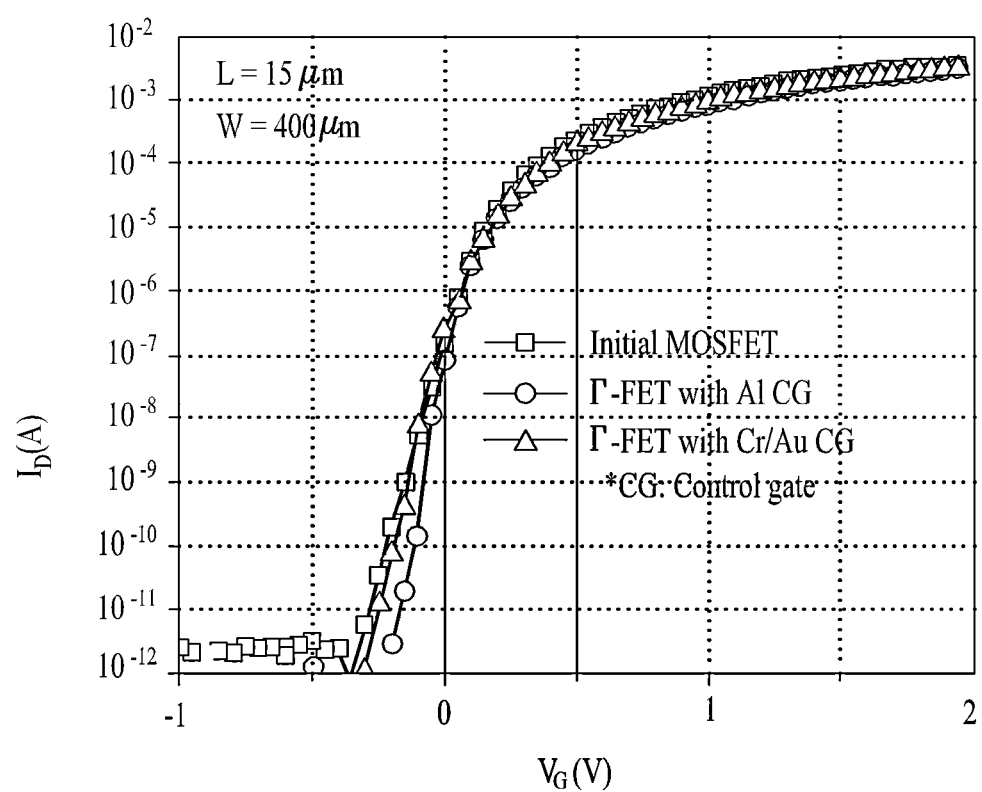
FIG. 9 is a view illustrating a result value of actually measuring a steep-slope field-effect transistor fabricated according to embodiments of the inventive concept.
Figure 10:
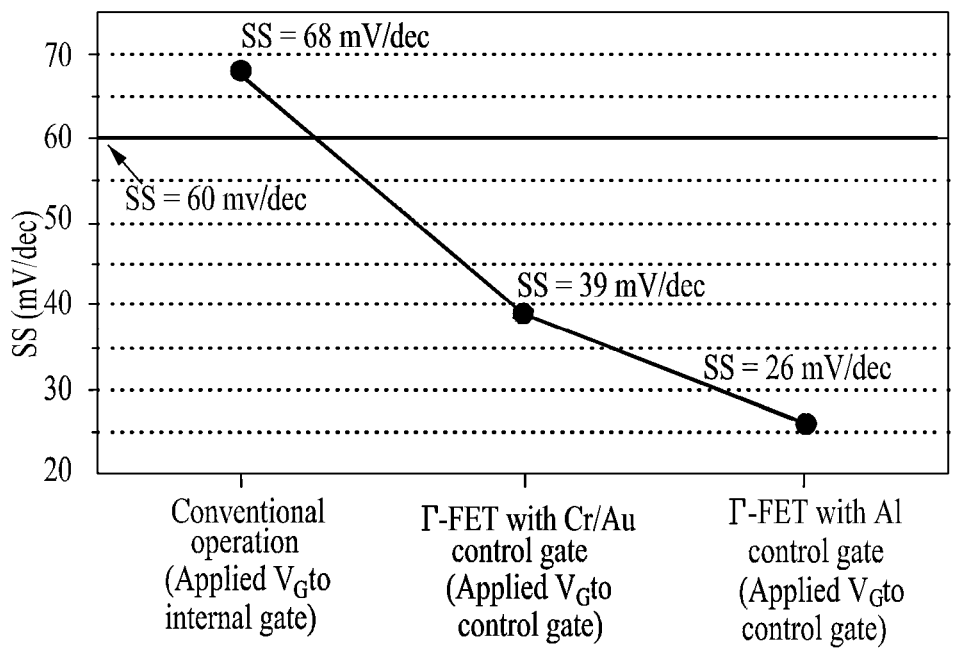
FIG. 10 is a view illustrating secondary data extracted from a result value of actually measuring a steep-slope field-effect transistor fabricated according to embodiments of the inventive concept.

FIG. 9 is a result value of actually measuring a Γ-FET 100 and a lower MOSFET, and FIG. 10 is secondary data extracted from it. The Γ-FET 100 may use only a smaller voltage for a switching operation than the lower MOSFET, and this may lead to a difference in subthreshold slope (SS). It may be seen that an SS value is greater than or equal to 60 mV/dec as is widely known for the lower MOSFET, whereas an SS of the Γ-FET 100 fabricated by adding the transition layer 102 and the control gate 101 on an upper portion thereof decreases to 26 mV/dec over the limit of 60 mV/dec. A cause why the steep-slope is implemented is because an amount of change in voltage of the control gate 101 is represented as a very large amount of change in voltage of the floating gate 103.

A detailed principle of implementing the steep-slope may be described by means of a formula which will be described below. A device of the inventive concept should meet a formula used in a memory of the existing planar floating gate 103 in form. In the memory of the floating gate 103, a voltage of the floating gate 103 is normally given as Equation 1 below with regard to capacitance coupling and a load in the floating gate 103.

$$V_{FG} = \frac{C_{CF}}{C_T}(V_{CG} - W_{CF}) + \frac{C_{DF}}{C_T}(V_D - W_{DF}) +$$
$$\frac{C_{SF}}{C_T}(V_S - W_{SF}) + \frac{C_{OX}}{C_T}(\varphi - W_{BF}) + \frac{1}{C_T}Q_F$$
[Equation 1]

Figure 11:
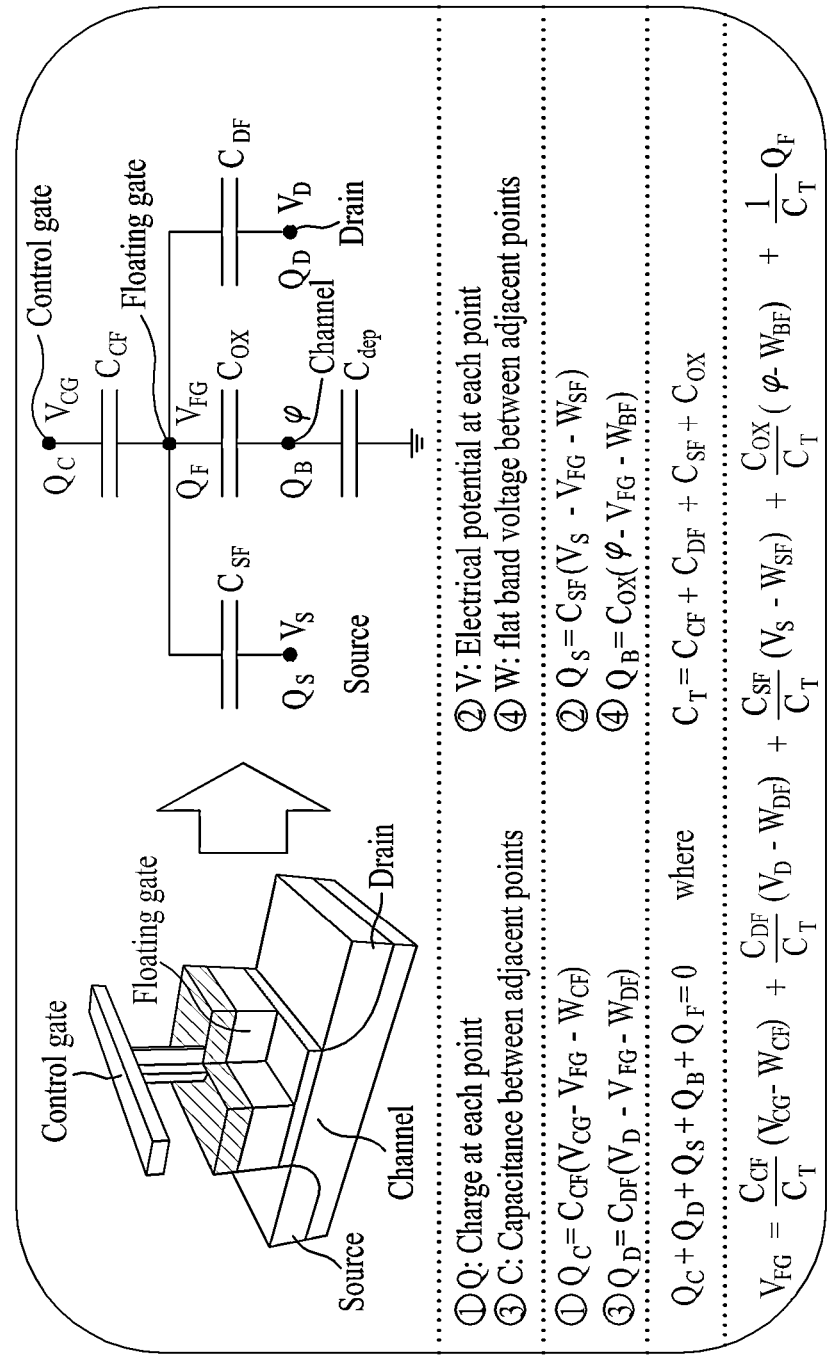
FIG. 11 is a view illustrating a process of deriving a floating gate voltage modeling formula.

FIG. 11 is a view illustrating a process of deriving a voltage formula of a floating gate 103. $Q_C$, $Q_F$, $Q_S$, $Q_B$, $Q_D$ refer to charges of respective points, that is, a control gate 101, a floating gate 103, a source 105, a surface of a channel 106, and a drain 107, and $V_{CG}$, $V_{FG}$, $V_S$, $\varphi\varphi$, $V_D$ refer to voltages of respective points, that is, the control gate 101, the floating gate 103, the source 105, the surface of the channel 106, and the drain 107. A capacitance and a flat-band voltage between the respective points may be respectively represented as alphabet C and subscript and alphabet W and subscript as shown in FIG. 11. In addition, the sum of all capacitances the floating gate 103 feels may be represented as $C_T$. As shown in FIG. 11, the voltage formula of the floating gate 103 may be derived without any other assumption using a basic C-V formula.

Variables which varies in value with a change in voltage of the control gate 101 may be a voltage $V_{CG}$ of the control gate 101, a voltage $V_{FG}$ of the floating gate 103, an internal load $Q_F$ of the floating gate 103, and a surface potential ($\varphi\varphi$) of the channel 106 of the lower MOSFET channel.

For a memory of the conventional floating gate 103, a load in the floating gate 103 is not a variable because of being kept constant, but a charge of the floating gate 103 becomes also variable because of being supplied from the control gate 101 to the floating gate 103 through the transition layer 102 in the Γ-FET 100 of the inventive concept.

When Equation 1 above is differentiated into a voltage of the control gate 101, a voltage change value of the floating gate 103 according to a change in voltage of the control gate 101 may be understood. Constants which are not changed disappear, only variables which vary with a voltage of the control gate 101 remain. This may be represented as Equation 2 below.

$$\frac{dV_{FG}}{dV_{CG}} = \frac{C_{CF}}{C_T}\frac{dV_{CG}}{dV_{CG}} + \frac{C_{OX}}{C_T}\frac{d\varphi}{dV_{CG}} + \frac{1}{C_T}\frac{dQ_F}{dV_{CG}}$$
[Equation 2]

Arranging Equation 2 above may be converted into Equation 3 below.

$$\frac{dV_{FG}}{dV_{CG}} = \frac{C_{CF}}{C_T} + \frac{C_{OX}}{C_T}\frac{d\varphi}{dV_{CG}} + \frac{1}{C_T}\frac{dQ_F}{dt}\frac{dt}{dV_{CG}}$$
[Equation 3]

Herein, t may refer to time. The left term of Equation 3 above is a change in voltage of the floating gate 103 compared to a change in voltage of the control gate, and a steep-slope is possible when this value becomes greater than 1.

The amount of change in charge of the floating gate 103 over time may be current which flows through the transition layer 102. Current (=$dQ_F$/dt) which flows through the transition layer 102 may be a function of a difference between voltages loaded onto both ends of the transition layer 102, that is, a voltage of the control gate 101 and a voltage of the floating gate 103. Thus, Equation 3 above may change to Equation 4 below.

$$\frac{dV_{FG}}{dV_{CG}} = \frac{C_{CF}}{C_T} + \frac{C_{OX}}{C_T}\frac{d\varphi}{dV_{CG}} + \frac{1}{C_T}f(V_{CG} - V_{FG})\frac{dt}{dV_{CG}}$$
[Equation 4]

Herein, f refers to current which flows through the transition layer, and is referred to as a transition current function to be used hereafter.

The transition current function may vary with voltage loaded onto both ends. A form and size of the transition current function may vary with a configuration and form of each of the control gate 101, the transition layer 102, and the floating gate 103, including a characteristic of the transition layer 102. A surface potential of the lower MOSFET among them may be deeply associated with a voltage of the floating gate 103. Rearranging Equation 4 above to suit it may be represented as Equation 5 below.

$$\frac{dV_{FG}}{dV_{CG}}\left(1 - \frac{C_{OX}}{C_T}\frac{d\varphi}{dV_{FG}}\right) = \frac{C_{CF}}{C_T} + \frac{1}{C_T}f(V_{CG} - V_{FG})\frac{dt}{dV_{CG}} \quad \text{[Equation 2]}$$

Arranging such that only a change in voltage of the floating gate 103 compared to a change in voltage of the control gate 101 remains on a left term of Equation 5 below may be represented as Equation 6 below.

$$\frac{dV_{FG}}{dV_{CG}} = \frac{\frac{C_{CF}}{C_T} + \frac{1}{C_T}f(V_{CG} - V_{FG})\frac{dt}{dV_{CG}}}{\left(1 - \frac{C_{OX}}{C_T}\frac{d\varphi}{dV_{FG}}\right)} \quad \text{[Equation 6]}$$

There are four things to note here. First, there is no second term of the numerator in the right term in the memory of the conventional floating gate 103. This is because current which flows from the control gate 101 to the floating gate 103 is not generated during a read operation. On the other hand, because there is a current term in the Γ-FET 100 of the inventive concept, the amount of change in voltage of the floating gate 103 may more increase than an existing technology. Secondly, when the denominator becomes less than 1 in a situation where the size of the numerator in the right term is adjusted to be large enough by means of the above-mentioned current term, because a change in voltage of the floating gate 103 becomes very large, steep-slope implementation is possible. Thirdly, the situation where the denominator of the right term becomes small is a situation where the amount of change in surface potential of the lower MOSFET becomes sufficiently large compared to a voltage of the floating gate 103. Fourthly, the situation occurs in a weak inversion region where ON/OFF of the lower MOSFET is divided.

As a result, when the Γ-FET 100 of the inventive concept sweeps a voltage of the control gate 101 in the situation of adjusting the amount of current which flows through the transition layer 102 to increase the numerator in the right term of Equation 6 above, a denominator value in the right term may become small in the region where the ON/OFF of the lower MOSFET is divided, and consequently, the amount of change in voltage of the floating gate 103 increases to be very large compared to a voltage of the control gate, such that the steep-slope is implemented.

As described above, the steep-slope operation is greatly affected by the transition current function f, that is, a function of current which flows through the transition layer. When the transition current function value is too smaller than a surrounding term ($C_{CF}/C_T$) irrespective of the size of voltage loaded onto both ends of the transition layer, the transition layer operates as the memory of the floating gate in which current does not flow and rather, the slope increases. On the other hand, when the transition layer operates as metal because the transition current function value is too large, because a voltage difference between the control gate and the floating gate is unable to be generated and because the amount of change in voltage of the floating gate and the amount of change in voltage of the control gate are always the same as each other, the steep-slope is unable to be implemented. For the steep-slope operation, the transition current function should be smaller than the surrounding term ($C_{CF}/C_T$), when voltage loaded onto both ends is small, and has a need to be larger than the surrounding term ($C_{CF}/C_T$), when the voltages loaded onto both the ends are large. In other words, the transition current function value should be larger or smaller than the surrounding term ($C_{CF}/C_T$) to vary with the voltage loaded onto both the ends.

As such, the steep-slope FET an embodiment of the inventive concept may implement steep-slope performance, in a transistor having a transition layer and a control gate on an upper portion of a gate of an existing FET.

Such inventive concept may meet a high on-current and a probability of miniaturization based on the structure and the operation principle of the existing MOSFET and may simultaneously show SS performance of 50% or more of the entire switching current duration and 60 mV/dec or less. By means of the structure and method, the inventive concept may implement a semiconductor device having the steep-slope performance while ensuring the high on-current and the probability of miniaturization in the existing MOSFET without change. Thus, a low-power operation of the semiconductor device is possible.

In addition, the steep-slope FET of the inventive concept may apply a certain voltage to the control gate, such that a potential difference of a reference voltage or more between the control gate and the floating gate is generated, thus implementing the operation of discharging or bringing in at least one charge stored in the floating gate. In other words, an operation method of the steep-slope according to an embodiment of the inventive concept may include applying a certain voltage to a control gate to generate a potential difference of a reference voltage or more between the control gate and a floating gate and discharging and bringing in at least one charge stored in the floating gate by means of the potential difference of the reference voltage or more, which is generated between the control gate and the floating gate.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the common part of the following claims.

The invention claimed is:
1. A steep-slope field-effect transistor, comprising:
a source, a channel region, and a drain formed on a substrate;
a gate insulating film formed on an upper portion of the channel region;
a floating gate formed on an upper portion of the gate insulating film;
a transition layer formed on an upper portion of the floating gate; and
a control gate formed on an upper portion of the transition layer;
wherein the steep-slope field-effect transistor applies a potential of a reference voltage or more to the control gate to generate a potential difference between the control gate and the floating gate and discharges or brings in at least one charge stored in the floating gate.

2. The steep-slope field-effect transistor of claim 1, wherein the channel region is formed as one of a non-embedded structure including a planar structure, a fin structure, a nanosheet structure, a nanowire structure, and a multi-nanowire structure and an embedded structure.

3. The steep-slope field-effect transistor of claim 2, wherein the channel region of the non-embedded structure is formed as one of the fin structure, the nanosheet structure, the nanowire structure, and the multi-nanowire structure used in a finFET, a tri-gate MOSFET, a Π-gate MOSFET, an Ω-gate MOSFET, a gate-all-around MOSFET, a bulk finFET, or a bulk gate-all-around MOSFET.

4. The steep-slope field-effect transistor of claim 2, wherein the channel region of the embedded structure is formed as one of embedded channel structures used in a buried gate MOSFET, a recessed gate MOSFET, a sphere-shaped recessed gate MOSFET, a saddle finFET, a groove gate MOSFET, or a V-groove gate MOSFET.

5. The steep-slope field-effect transistor of claim 1, wherein the channel region, the source, and the drain include at least one of silicon, germanium, silicon-germanium, strained silicon, strained germanium, strained silicon-germanium, silicon on insulator (SOI), and III-V semiconductor materials.

6. The steep-slope field-effect transistor of claim 1, wherein the source and the drain are formed on left and right sides of the channel region for a lateral transistor, are formed on upper and lower portions of the channel region for a vertical transistor, and are formed of one of n-type silicon, p-type silicon, and metal silicide.

7. The steep-slope field-effect transistor of claim 6, wherein the source and the drain formed of the n-type silicon or the p-type silicon are formed by at least one of diffusion, solid-phase diffusion, epitaxial growth, selective epitaxial growth, ion implantation, or subsequent heat-treatment.

8. The steep-slope field-effect transistor of claim 6, wherein the source and the drain formed of the metal silicide include the metal silicide formed of one of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), and iridium (Ir) to improve junction using dopant segregation.

9. The steep-slope field-effect transistor of claim 1, wherein the gate insulating film includes at least one of silicon oxide ($SiO_2$), silicon nitride ($Si_3N_4$), silicon oxynitride (SiON), hafnium oxide ($HfO_2$), aluminum oxide ($Al_2O_3$), zirconium oxide ($ZrO_2$), hafnium zirconium oxide (HZO), or hafnium oxynitride (HfON).

10. The steep-slope field-effect transistor of claim 1, wherein the floating gate is formed by at least one or more of metal, two or three types of metal alloys, n+ polycrystalline silicon, p+ polycrystalline silicon, or silicide.

11. The steep-slope field-effect transistor of claim 1, wherein the floating gate is formed as at least one of a non-embedded gate structure including a planar-gate structure, a multiple-gate structure, or a gate-all-around structure and an embedded gate structure, depending on a channel structure.

12. The steep-slope field-effect transistor of claim 11, wherein the floating gate of the non-embedded gate structure is formed as one of non-embedded gate structures used in a finFET, a tri-gate MOSFET, a Π-gate MOSFET, an Ω-gate MOSFET, a gate-all-around MOSFET, a bulk finFET, or a bulk gate-all-around MOSFET.

13. The steep-slope field-effect transistor of claim 11, wherein the floating gate of the embedded gate structure is formed as one of embedded gate structures used in a buried gate MOSFET, a recessed gate MOSFET, a sphere-shaped recessed gate MOSFET, a saddle finFET, a groove gate MOSFET, or a V-groove gate MOSFET.

14. The steep-slope field-effect transistor of claim 1, wherein the transition layer is formed including silicon (Si), germanium (Ge), Group III-V compounds, a 2-D material, silicon nitride ($Si_3N_4$), a nitride film, silicon oxynitride (SiON), silicon oxide ($SiO_2$), a solid oxide film, aluminum oxide ($Al_2O_3$), IGZO, hafnium oxide ($HfO_2$), a transition material, a semiconductor material, a solid electrolyte material.

15. The steep-slope field-effect transistor of claim 1, wherein the steep-slope field-effect transistor more increases a change in voltage of the floating gate than a change in voltage of the control gate, when the control gate arrives at a specific voltage region, in a situation where at least one charge stored in the floating gate passes through an energy barrier by the transition layer to be discharged or brought in to the control gate, when a potential of a reference voltage or more is applied to the control gate.

16. The steep-slope field-effect transistor of claim 1, wherein the steep-slope field-effect transistor more decreases a slope value of a threshold voltage or less, when putting the control gate as a gate to operate a device than when putting the floating gate as a gate to operate the device.

17. A method for fabricating a steep-slope field-effect transistor, the method comprising:
    forming a source, a channel region, and a drain on a substrate;
    forming a gate insulating film on an upper portion of the channel region;
    forming a floating gate on an upper portion of the gate insulating film;
    forming a transition layer on an upper portion of the floating gate; and
    forming a control gate on an upper portion of the transition layer,
    wherein the forming of the control gate includes:
    forming an inter-layer dielectric on an upper portion of the transition layer;
    etching the inter-layer dielectric to expose a portion of the upper portion of the transition layer; and
    forming the control gate on an upper portion of the exposed transition layer.

18. An operation method for a steep-slope field-effect transistor including a source, a channel region, and a drain formed on a substrate, a gate insulating film formed on an upper portion of the channel region, a floating gate formed on an upper portion of the gate insulating film, a transition layer formed on an upper portion of the floating gate, and a control gate formed on an upper portion of the transition layer, the operation method comprising:
    applying a certain voltage to the control gate, such that a potential difference of a reference voltage or more is generated between the control gate and the floating gate; and
    discharging or bringing in at least one charge stored in the floating gate by means of the potential difference of the reference voltage, the potential difference being generated between the control gate and the floating gate.

19. The steep-slope field-effect transistor of claim 14, wherein the 2-D material comprises at least one of a carbon nanotube, $MoS_2$, and graphene.

20. The steep-slope field-effect transistor of claim 14, wherein the solid electrolyte material includes a sulfide-based material, an oxide-based material, and an ion conductive polymer.

21. The steep-slope field-effect transistor of claim 14, wherein the semiconductor material includes $SrTiO_3$, $SrZrO_3$, NiO, $TiO_2$, $HfO_x$, $AlO_x$, $NiO_x$, $TiO_x$, $TaO_x$, TaN, $Cu_xO$, $CuO_x$, TiN, TaN, $WO_x$, $SiN_x$, $VO_2$, $IrO_2$, $ZrO_x$, ZnO, $NbO_x$, IGZO, HZO, or HfON.

* * * * *